United States Patent
Wu et al.

(10) Patent No.: US 9,419,139 B2
(45) Date of Patent: Aug. 16, 2016

(54) NITRIDE LAYER PROTECTION BETWEEN PFET SOURCE/DRAIN REGIONS AND DUMMY GATE DURING SOURCE/DRAIN ETCH

(71) Applicant: GLOBALFOUNDRIES Inc., Grand Cayman (KY)

(72) Inventors: Xusheng Wu, Ballston Lake, NY (US); Hongxiang Mo, Malta, NY (US); Qi Zhang, Mechnicville, NY (US); Byoung-Gi Min, Cohoes, NY (US); Jeasung Park, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/560,428

(22) Filed: Dec. 4, 2014

(65) Prior Publication Data

US 2016/0163859 A1    Jun. 9, 2016

(51) Int. Cl.
| | | |
|---|---|---|
| H01L 29/78 | (2006.01) | |
| H01L 29/161 | (2006.01) | |
| H01L 29/165 | (2006.01) | |
| H01L 29/66 | (2006.01) | |
| H01L 21/02 | (2006.01) | |
| H01L 21/306 | (2006.01) | |

(52) U.S. Cl.
CPC ........ *H01L 29/7848* (2013.01); *H01L 21/0217* (2013.01); *H01L 21/0228* (2013.01); *H01L 21/02057* (2013.01); *H01L 21/02167* (2013.01); *H01L 21/02247* (2013.01); *H01L 21/02381* (2013.01); *H01L 21/02532* (2013.01); *H01L 21/30604* (2013.01); *H01L 29/161* (2013.01); *H01L 29/165* (2013.01); *H01L 29/6656* (2013.01); *H01L 29/66545* (2013.01); *H01L 21/02252* (2013.01)

(58) Field of Classification Search
None
See application file for complete search history.

(56) References Cited

U.S. PATENT DOCUMENTS

| | | | | |
|---|---|---|---|---|
| 2007/0072353 | A1* | 3/2007 | Wu | H01L 29/66636 438/197 |
| 2011/0049627 | A1* | 3/2011 | Chang | H01L 29/66636 257/347 |
| 2011/0073956 | A1* | 3/2011 | Heinrich | H01L 27/0629 257/379 |
| 2011/0303951 | A1* | 12/2011 | Zhu | H01L 29/045 257/192 |
| 2012/0326243 | A1* | 12/2012 | Huang | H01L 29/4966 257/410 |
| 2014/0001540 | A1* | 1/2014 | Wang | H01L 29/66666 257/329 |
| 2014/0138745 | A1* | 5/2014 | Shin | H01L 29/4966 257/192 |
| 2015/0035084 | A1* | 2/2015 | Li | H01L 29/66545 257/410 |
| 2015/0179512 | A1* | 6/2015 | Lai | H01L 21/76877 257/754 |

* cited by examiner

*Primary Examiner* — Charles Garber
*Assistant Examiner* — Alia Sabur
(74) *Attorney, Agent, or Firm* — Ditthavong & Steiner, P.C.

(57) ABSTRACT

Methods of using a nitride to protect source/drain regions during dummy gate removal and the resulting devices are disclosed. Embodiments include forming an oxide layer on a substrate; forming a nitride protection layer on the oxide layer; forming a dummy gate layer on the nitride protection layer; patterning the oxide, nitride, and dummy gate layers forming first and second dummy gate stacks on first and second portions of the substrate, each dummy gate stack comprising a dummy gate, the nitride protection layer, and the oxide layer, wherein a portion of the oxide layer extends along the substrate beyond side edges of the dummy gate; forming first and second source/drain cavities in the substrate at opposite sides of the first and second dummy gate stacks, respectively; growing first and second eSiGe source/drain regions in the first and second source/drain cavities, respectively; and removing the first dummy gate and the second dummy gate stack.

15 Claims, 8 Drawing Sheets

BACKGROUND

BACKGROUND

BACKGROUND

BACKGROUND

NITRIDE LAYER PROTECTION BETWEEN PFET SOURCE/DRAIN REGIONS AND DUMMY GATE DURING SOURCE/DRAIN ETCH

TECHNICAL FIELD

The present disclosure relates to fabrication of replacement metal gate (RMG) p-type field effect transistor (PFET) devices. The present disclosure is particularly applicable to PFET devices with embedded silicon germanium (eSiGe) source/drain regions for the 20 nanometer (nm) and 14 nm technology nodes and beyond

BACKGROUND

In forming a dummy gate electrode in a RMG process, a thick oxide layer is formed on a substrate followed by a polysilicon or amorphous silicon layer, and a nitride capping layer, and the three layers are patterned and etched, for example by reactive ion etching (RIE). As illustrated in FIG. 1A, after etching the nitride capping layer 101, dummy gate 103, and oxide layer 105, a portion 107 of the oxide layer remains on the substrate 109 beyond the edge of the dummy gate. The oxide portion 107, or oxide footing, is difficult to remove without recessing the active surface of the substrate during the dummy gate RIE. As illustrated in FIG. 1B, spacers 111 are formed over the oxide footing 107.

In both planar and fin-type field effect transistor technologies, eSiGe is commonly employed for PFET source/drain regions for performance improvement. The eSiGe at the source/drain regions generates compressive stress to the channel which enhances hole mobility. For an eSiGe structure, both closer tip-to-tip (source-to-drain) and tip closer to the channel surface will introduce increased stress to the channel which further boosts mobility and performance. Such an eSiGe structure is referred to as "aggressive eSiGe". Before eSiGe can be grown, a recess 113 is formed with SiCoNi material for a clean surface and growth interface. However, such materials etch away the oxide layer under the dummy gate at the source/drain boundaries (i.e., the oxide footing) at 115 in FIG. 1C, which is particularly problematic for aggressive eSiGe and will generate "mouse bite" defects. The mouse bite defects in turn introduce an effective channel 117 from the dummy gate to the bottom silicon substrate, as illustrated in FIG. 1D. During removal of the dummy gate to form a RMG, this channel 117 will serve as a weak point and result in an active region 119 hole defect, which reduces yield.

A need therefore exists for methodology enabling elimination of the mouse bite defects and the resulting devices.

SUMMARY

An aspect of the present disclosure is a method of forming a PFET with a using a nitride protection layer over the gate oxide during eSiGe source/drain formation.

Another aspect of the present disclosure is a method of forming a PFET including plasma nitridation of dummy gate sidewalls and oxide footers to prevent holes from developing between the dummy gate and the source/drain regions during the source/drain cavity etch.

Another aspect of the present disclosure is a PFET with a dielectric material filling all space between the dummy gate and the source/drain regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an oxide layer on a substrate; forming a nitride protection layer on the oxide layer; forming a dummy gate layer on the nitride protection layer; patterning the oxide, nitride, and dummy gate layers forming first and second dummy gate stacks on first and second portions of the substrate, each dummy gate stack comprising a dummy gate, the nitride protection layer, and the oxide layer, wherein a portion of the oxide layer extends along the substrate beyond side edges of the dummy gate; forming first and second source/drain cavities in the substrate at opposite sides of the first and second dummy gate stacks, respectively; and growing first and second eSiGe source/drain regions in the first and second source/drain cavities, respectively; and removing the first dummy gate and the second dummy gate stack.

Aspects of the present disclosure include forming the nitride protection layer of silicon nitride (SiN), amorphous carbon nitride, silicon carbon nitride (SiCN), high-k nitride, or low-k nitride. Further aspects include forming first and second low-k dielectric spacers at opposite sides of the first and second dummy gate stacks, respectively, prior to forming the first and second source/drain cavities. Other aspects include: removing the nitride protection layer from the first dummy gate stack subsequent to removing the first dummy gate. Additional aspects include, subsequent to removing the nitride protection layer from the first dummy gate stack, further forming a first interfacial layer (IL) and a first high-k dielectric layer between the first low-k dielectric spacers and along side edges of the oxide layer; forming a second IL and second high-k dielectric layer between the second low-k dielectric spacers; and forming first and second metal gates over the first and second high-k dielectric layers, respectively. Another aspect includes forming the first IL and first high-k dielectric layer by atomic layer deposition (ALD). A further aspecs includes the oxide layer, first ILD, first high-k dielectric layer, first metal gate, and first eSiGe source/drain regions forming a p-type input/output (I/O) device and the second ILD, second high-k dielectric layer, second metal gate, and second eSiGe source/drain regions forming a p-type core device. Other aspects include forming the nitride protection layer to a thickness of 1 to 10 nm. An additional aspect includes forming the dummy gate layer of amorphous silicon or polysilicon. A further aspect includes wet cleaning surfaces of the first and second source/drain cavities prior to growing the first and second eSiGe source/drain regions.

Another aspect of the present disclosure is a method including: forming an oxide layer on a substrate; forming a dummy gate layer on the oxide layer; patterning the oxide and dummy gate layers forming a gate stack comprising a dummy gate and the oxide layer, wherein a portion of the oxide layer extends along the substrate beyond sidewalls of the dummy gate; forming a nitride layer from the sidewalls of the dummy gate and from the portion of the oxide layer; forming spacers on opposite sides of the dummy gate stack on the nitride layer; forming source/drain cavities in the substrate at opposite sides of dummy gate stack; growing eSiGe source/drain regions in the source/drain cavities; and replacing the dummy gate with a high-k dielectric layer and a metal gate.

Aspects include forming the nitride layer by plasma nitridation. Further aspects include the high-k dielectric, metal gate, and eSiGe source/drain regions forming a p-type I/O)

device. Additional aspects include forming the dummy gate layer of amorphous silicon or polysilicon.

Another aspect of the present disclosure is a device including: a silicon substrate; an oxide layer on the silicon substrate; an interfacial layer and a high-k dielectric layer on the oxide layer; a metal gate on the high-k dielectric layer; spacers on opposite sides of the metal gate; eSiGe source/drain regions at opposite sides of the metal gate in the silicon substrate and extending under the oxide layer; and a dielectric material filling all space between the eSiGe source/drain regions and the metal gate along opposite edges of the oxide layer.

Aspects include the dielectric material including the IL and high-k dielectric layer. Further aspects include the dielectric material being formed by: forming an oxide layer on a substrate; forming a nitride protection layer on the oxide layer; forming a dummy gate layer on the nitride protection layer; patterning the oxide, nitride, and dummy gate layers forming a dummy gate stack comprising a dummy gate, the nitride protection layer, and the oxide layer, wherein a portion of the oxide layer extends along the substrate beyond side edges of the dummy gate; forming low-k dielectric spacers at opposite sides of the dummy gate stacks; forming source/drain cavities in the substrate at opposite sides of the dummy gate stack; growing the eSiGe source/drain regions in the source/drain cavities; removing the dummy gate; removing the nitride protection layer; and depositing the IL and high-k dielectric layer between the first low-k dielectric spacers and along side edges of the oxide layer by ALD. Other aspects include the dielectric material including a nitride. Additional aspects include the nitride being formed by: forming an oxide layer on a substrate; forming a dummy gate layer on the oxide layer; patterning the oxide and dummy gate layers forming a dummy gate stack comprising a dummy gate and the oxide layer, wherein a portion of the oxide layer extends along the substrate beyond side edges of the dummy gate; plasma nitridation of the portion of the oxide layer. Another aspect includes a nitride layer between the metal gate and the spacers, the nitride layer being formed by plasma nitridation of sidewalls of the dummy gate concurrently with plasma nitridation of the portion of the oxide layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1B:
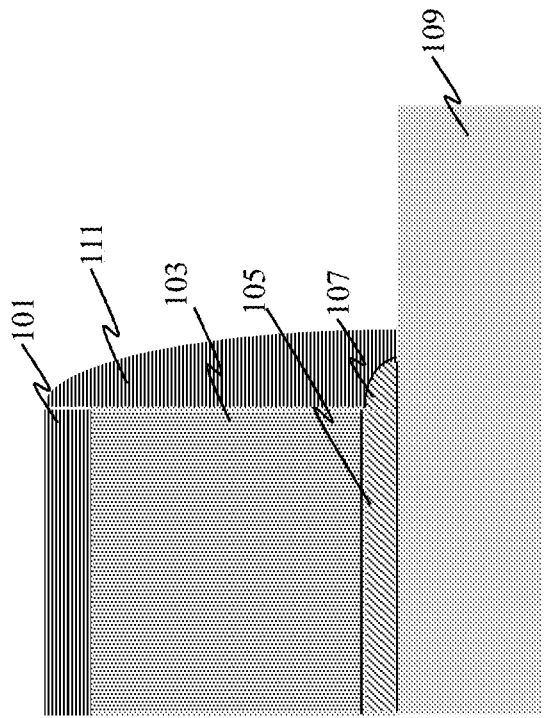
FIGS. 1A through 1D schematically illustrate the development of a mouse bit defect during eSiGe formation.
Figure 1A:
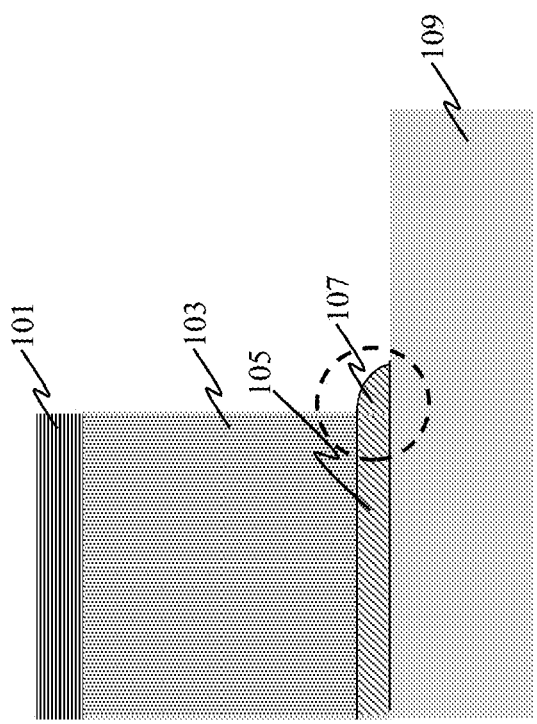
Figure 1D:
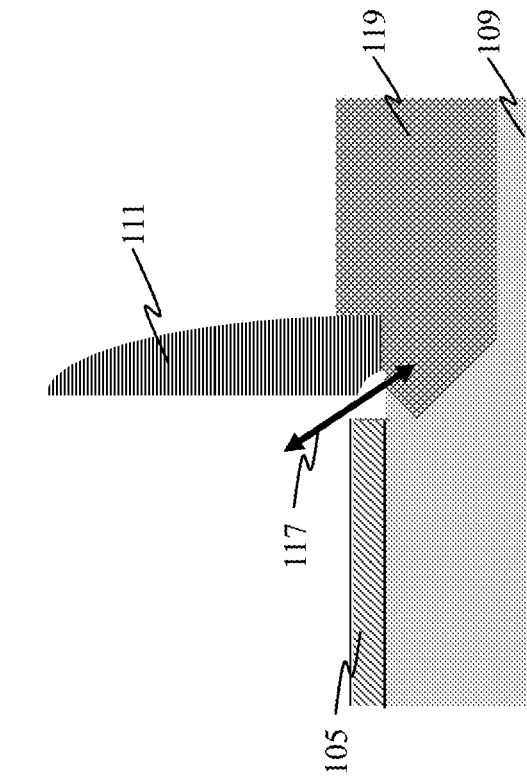
Figure 1C:
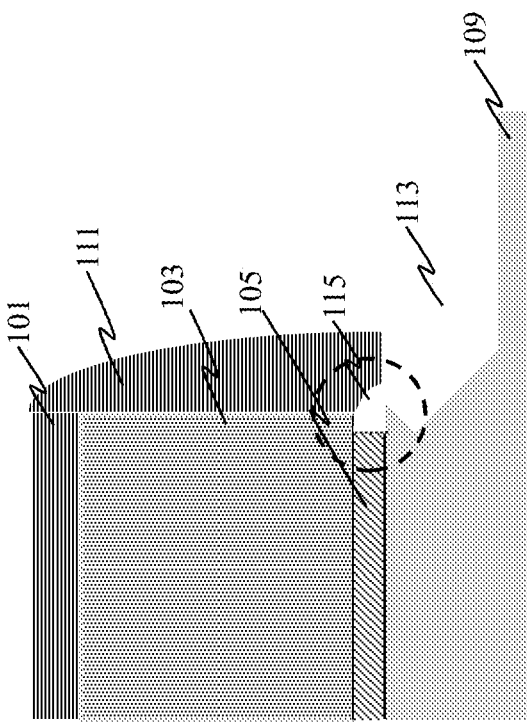

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of mouse bite defects and the resultant eSiGe damage attendant upon dummy gate removal for a PFET RMG. In accordance with embodiments of the present disclosure, a nitride layer is formed over the oxide during source/drain formation or plasma nitridation is performed to transform the oxide footing into a nitride layer, thereby preventing holes from forming between the dummy gate and the source/drain regions.

Methodology in accordance with embodiments of the present disclosure includes forming an oxide layer, a nitride protection layer, and a dummy gate layer on a substrate, and patterning the oxide, nitride, and dummy gate layers forming first and second dummy gate stacks on first and second portions of the substrate, each dummy gate stack including a dummy gate, the nitride protection layer, and the oxide layer. After patterning, a portion of the oxide layer extends along the substrate beyond side edges of the dummy gate. Next, first and second source/drain cavities are formed in the substrate at opposite sides of the first and second dummy gate stacks, respectively, and first and second eSiGe source/drain regions are grown in the first and second source/drain cavities, respectively; and removing the first dummy gate and the second dummy gate stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2 through 9 schematically illustrate a process flow for forming PFET devices in accordance with an exemplary embodiment. Adverting to FIG. 2, an oxide layer 201 is deposited or formed by thermal oxidation on a silicon substrate 203 followed by the deposition of a nitride protection layer 205. Nitride protection layer 205 may, for example, be SiN, SiCN, amorphous carbon nitride, a high-k nitride or a low-k nitride and may be deposited to a thickness of 1 nm to 10 nm.

Figure 3:
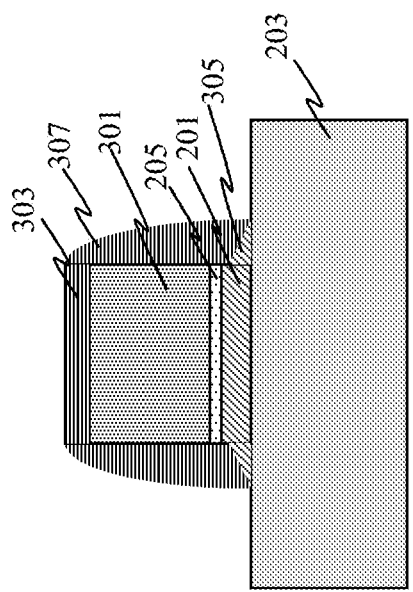
FIGS. 2 through 9 schematically illustrate a process flow for forming a p-type RMG, protecting the source/drain regions during dummy gate removal, in accordance with an exemplary embodiment.

As illustrated in FIG. 3, a polysilicon or amorphous silicon dummy gate 301 and nitride cap 303 are formed on protection layer 205 (by sequentially forming a polysilicon or amorphous silicon layer and a nitride cap layer and patterning the nitride cap layer 303, the polysilicon or amorphous silicon layer 301, the nitride protection layer 205, and the oxide layer 201). Oxide footing 305 remains on the substrate 203, extending beyond the edge of the dummy gate 301. Next, low-k dielectric spacers 307 are formed on opposite sides of polysilicon gate 301 and over the oxide footing 305.

Figure 4:
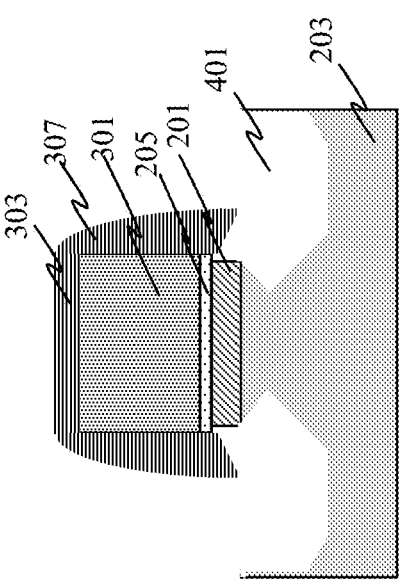

Adverting to FIG. 4, source/drain cavities 401 are formed in substrate 203 by, for example a wet etch with SiCoNi. The wet etch removes the oxide footing 305 as well as cleans the silicon surface of the cavities in the silicon substrate. The cleaning prior to growing the eSiGe enhances the quality of the epitaxial growth. However, the etchant cannot attack the dummy gate, as nitride layer 205 is not etched and therefore protects this weak point.

Figure 5:
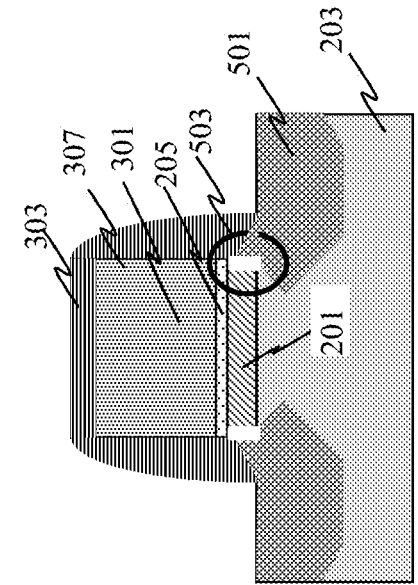
Figure 2:
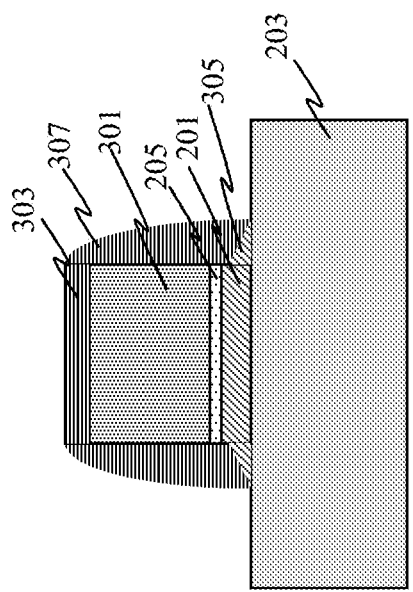

As illustrated in FIG. 5, eSiGe source/drain regions 501 are grown in cavities 401. However, the eSiGe does not completely fill all of the space where oxide footing 305 had been. Instead, a void 503 remains adjacent oxide layer 201. Although a single gate electrode has been shown in FIGS. 1 through 5, the process steps up through FIG. 5 apply to both p-type I/O devices and p-type core devices. Subsequent figures show both the I/O device and the core device.

Figure 6:
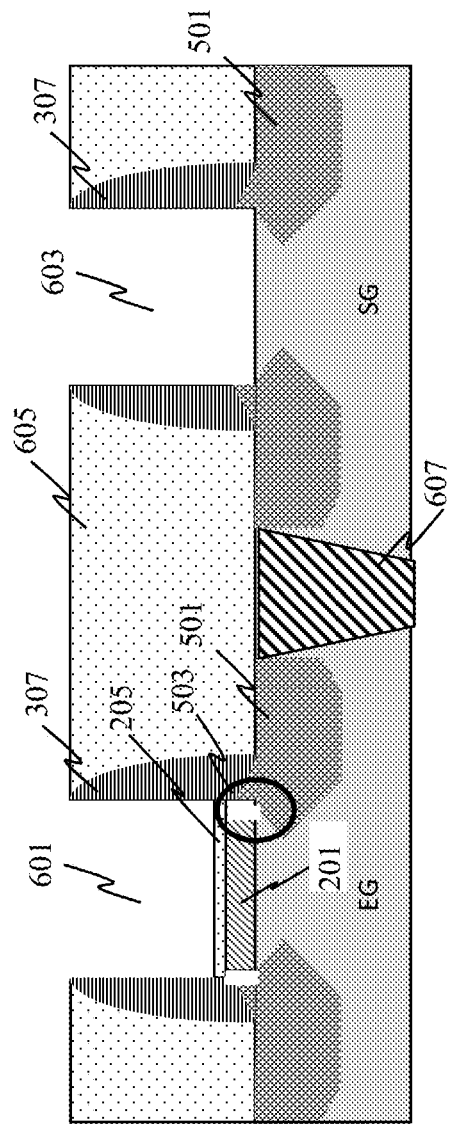

Next, as illustrated in FIG. 6, nitride cap layer 303 and dummy gate 301 are removed from both the I/O device (EG) and the core device (SG), forming cavities 601 and 603, respectively. An interlayer dielectric (ILD) 605 surrounds spacers 307 and fills space between the two devices, and a shallow trench isolation (STI) region 607 in substrate 203 electrically isolating the two devices. In addition, nitride layer 205 and oxide layer 201 are removed from the core device. In the I/O device, there is no direct channel from the dummy gate to the source/drain regions due to the nitride protection layer 205. Accordingly, the source/drain regions are not attacked by the dummy gate etchant.

Figure 7:
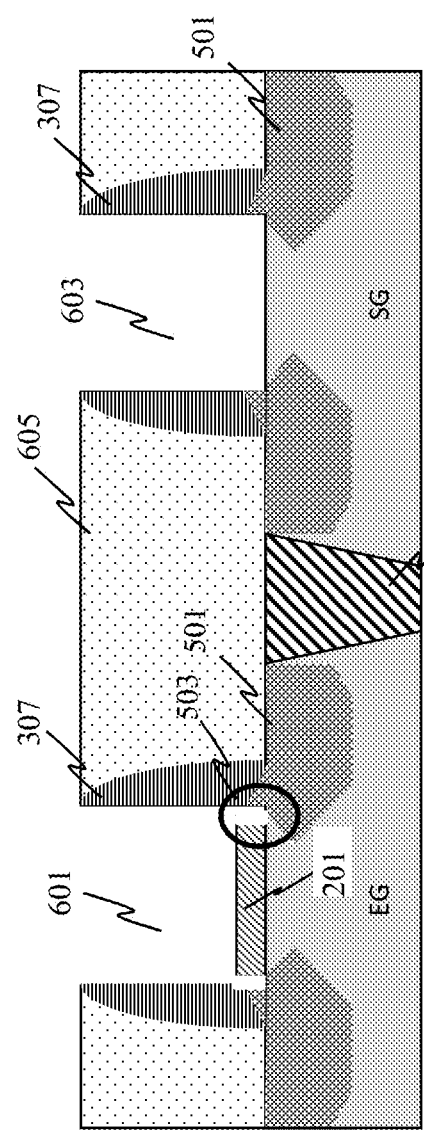
Figure 8:
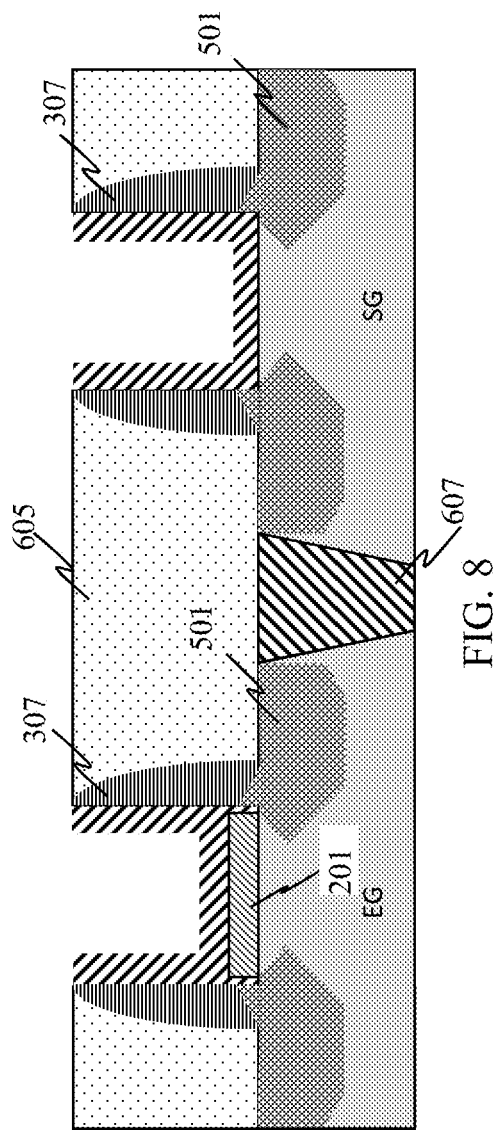
Figure 9:
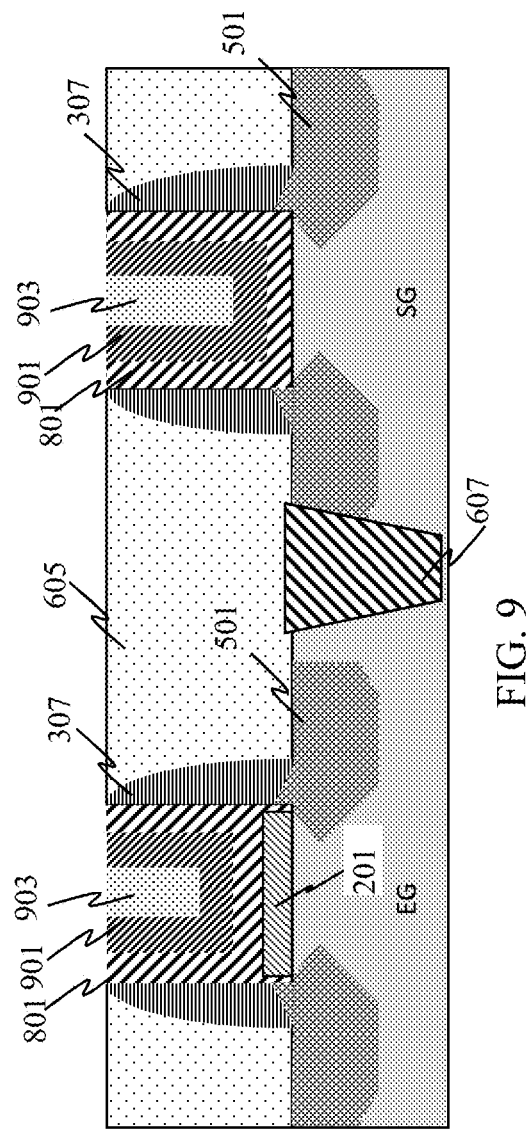

Adverting to FIG. 7, nitride layer 205 is removed from the I/O device. As illustrated in FIG. 8, IL/high-k layers 801 are deposited in cavities 601 and 603 on sidewall and bottom surfaces. The IL/high-k layers 801 are deposited by ALD, which fills small areas such as voids 503. As a result, the I/O device is free of leakage and breakdown weak point. The RMG process is then completed in FIG. 9 with deposition of metal gate 901 and tungsten fill 903 in each of the two devices.

FIGS. 10 through 13 schematically illustrate a process flow for forming a p-type RMG, protecting the source/drain regions during dummy gate removal, in accordance with another exemplary embodiment. Adverting to FIG. 10, a thick oxide layer is formed on a substrate followed by a polysilicon or amorphous silicon layer, and a nitride capping layer, and the three layers are patterned and etched, for example by RIE. After etching, nitride capping layer 1001, dummy gate 1003, and oxide layer 1005, including oxide footing 1007, remain on the silicon substrate 1009.

Figure 11:
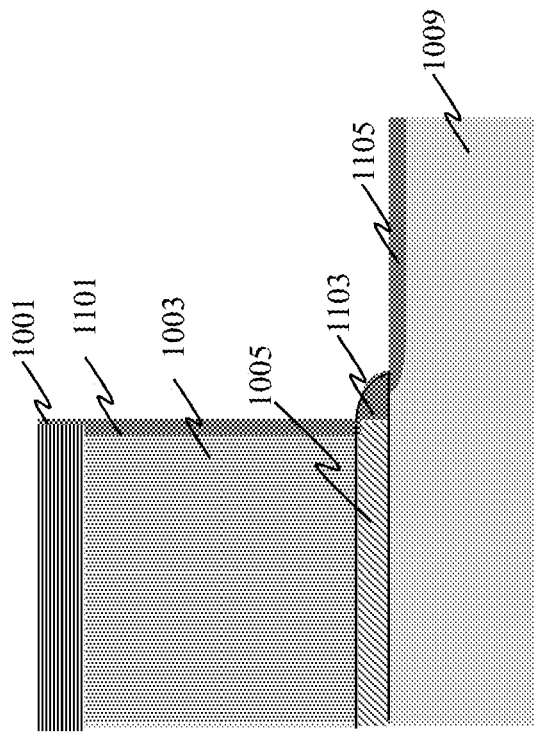
FIGS. 10 through 13 schematically illustrate a process flow for forming a p-type RMG, protecting the source/drain regions during dummy gate removal, in accordance with another exemplary embodiment.
Figure 10:
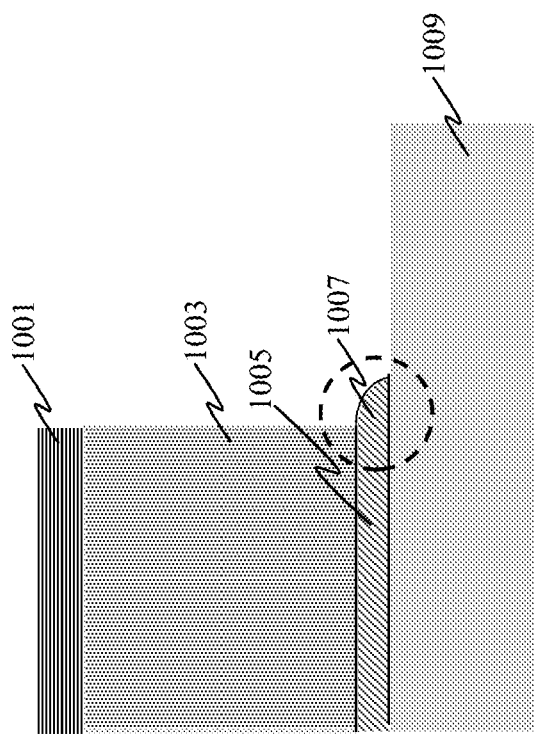
Figure 13:
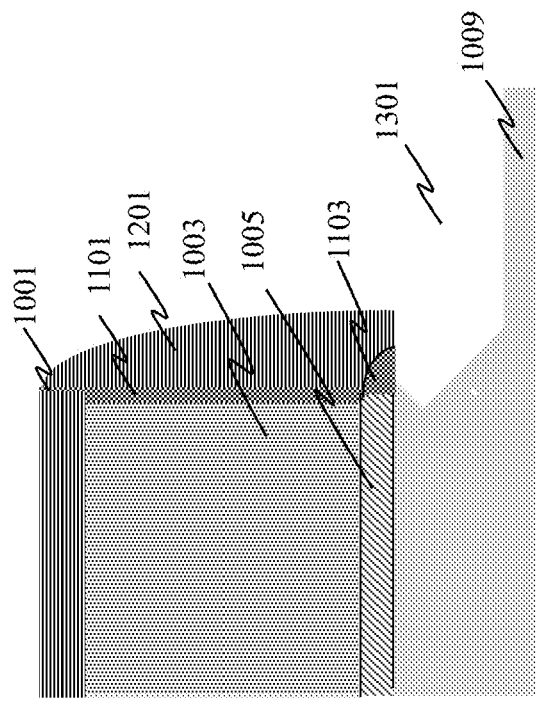
Figure 14:
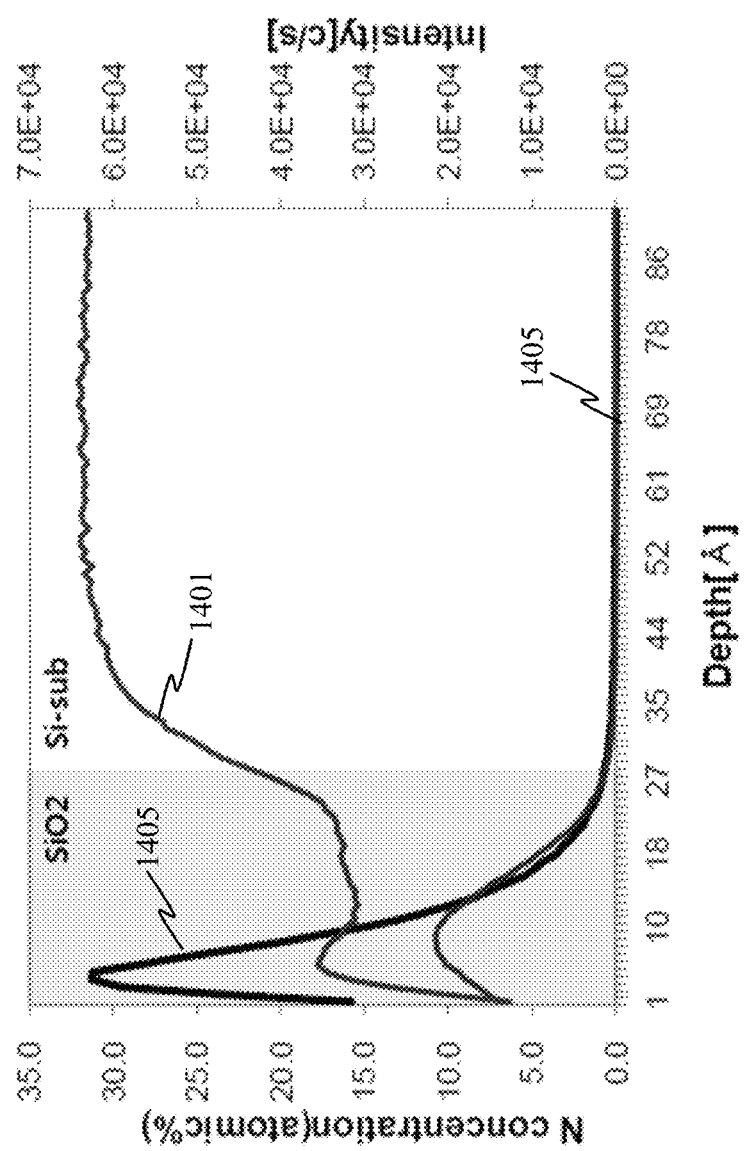
FIG. 14 shows the optimal surface concentration for the plasma nitridation, in accordance with the second exemplary embodiment

Next, as illustrated in FIG. 11, plasma nitridation is performed, forming a nitride layer 1101 along the side of dummy gate 1003, transforming oxide footing 1007 into a nitride 1103, and forming a thin nitride layer 1105 on the substrate surface. Conventionally an oxide forms at the edge of the dummy gate, and during dummy gate removal, the oxide is removed as well, increasing the gate width. The nitride, however, has high selectivity with the silicon etch, so the gate width remains constant during subsequent dummy gate removal. Plasma nitridation is a conformal process, forming a uniform nitride layer. Nitride layer 1101 is formed to a thickness of 0.5 nm to 5 nm. However, process time may be controlled to form a thicker nitride. FIG. 14 shows the optimal surface concentration for the plasma nitridation. Specifically, curve 1401 represents silicon, 1403 represents oxygen, and 1405 represents nitrogen.

Figure 12:
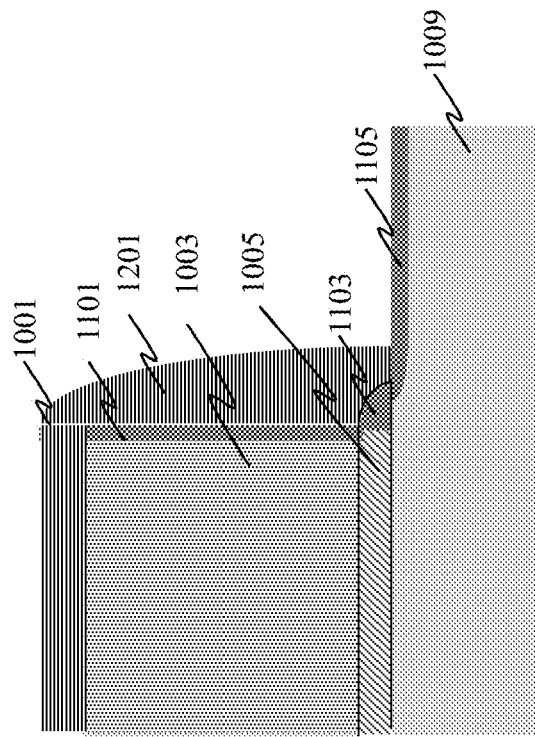

Spacers 1201 are then formed at the edges of dummy gate, over nitride layer 1101, as illustrated in FIG. 12. Adverting to FIG. 13, source/drain cavities 1401 are etched in substrate 1009 at opposite sides of dummy gate 1003. However, nitride 1103 is selective to the etchants used for silicon. Therefore, nitride 1103 is not etched and protects the dummy gate from being attacked. The cavities 1401 may then be filled by growing eSiGe source/drain regions (as illustrated in FIG. 5), and RMG processing may continue with dummy gate removal (such as illustrated in FIG. 6), and IL/high-k dielectric and metal gate formation. During the dummy gate removal, nitride 1103 prevents the etchant from reaching and damaging the eSiGe source/drain regions.

The embodiments of the present disclosure can achieve several technical effects, such as preventing holes from developing between a dummy gate and source/drain regions during source/drain cavity etches, thereby preventing damage to the eSiGe source/drain regions during dummy gate removal, and preventing gate widening during dummy gate and gate oxide removal. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated PFET semiconductor devices, particularly for the 20 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming an oxide layer on a substrate;
    forming a nitride protection layer on the oxide layer;
    forming a dummy gate layer on the nitride protection layer;
    patterning the oxide, nitride, and dummy gate layers forming first and second dummy gate stacks on first and second portions of the substrate, each dummy gate stack comprising a dummy gate, the nitride protection layer, and the oxide layer, wherein a portion of the oxide layer extends along the substrate beyond side edges of the dummy gate;
    forming first and second source/drain cavities in the substrate at opposite sides of the first and second dummy gate stacks, respectively;
    forming first and second low-k dielectric spacers at opposite sides of the first and second dummy gate stacks, respectively;
    growing first and second embedded silicon germanium (eSiGe) source/drain regions in the first and second source/drain cavities, respectively;
    removing the first dummy gate and the second dummy gate stack;

removing the nitride protection layer from the first dummy gate stack, leaving the oxide layer in the first dummy gate stack;

removing the nitride protection layer and the oxide layer from the second dummy gate stack; and replacing the first dummy gate with a first high-k dielectric layer and a first metal gate, wherein the first high-k dielectric layer is formed between the first low-k dielectric spacers and along side edges of the oxide layer, resulting in filling of gaps between the oxide layer and the first low-k dielectric spacers.

2. The method according to claim 1, comprising forming the nitride protection layer of silicon nitride (SiN), amorphous carbon nitride, silicon carbon nitride (SiCN), high-k nitride, or low-k nitride.

3. The method according to claim 1, further comprising:
forming a second high-k dielectric layer between the second low-k dielectric spacers; and
forming a second metal gate, wherein the first and second metal gates are formed over the first and second high-k dielectric layers, respectively.

4. The method according to claim 3, comprising forming the first high-k dielectric layer by atomic layer deposition (ALD).

5. The method according to claim 3, wherein at least the oxide layer, first high-k dielectric layer, first metal gate, and first eSiGe source/drain regions form a p-type input/output (I/O) device and at least the second high-k dielectric layer, second metal gate, and second eSiGe source/drain regions form a p-type core device.

6. The method according to claim 1, comprising forming the nitride protection layer to a thickness of 1 to 10 nanometers (nm).

7. The method according to claim 1, comprising forming the dummy gate layer of amorphous silicon or polysilicon.

8. The method according to claim 1, further comprising wet cleaning surfaces of the first and second source/drain cavities prior to growing the first and second eSiGe source/drain regions.

9. A method comprising:
forming an oxide layer on a substrate;
forming a dummy gate layer on the oxide layer;
patterning the oxide and dummy gate layers forming a gate stack comprising a dummy gate and the oxide layer, wherein a portion of the oxide layer extends along the substrate beyond sidewalls of the dummy gate;
forming a nitride layer from the sidewalls of the dummy gate and from the portion of the oxide layer;
forming spacers on opposite sides of the dummy gate stack on the nitride layer;
forming source/drain cavities in the substrate at opposite sides of dummy gate stack;
growing silicon germanium (eSiGe) source/drain regions in the source/drain cavities; and
replacing the dummy gate with a high-k dielectric layer and a metal gate.

10. The method according to claim 9, comprising forming the nitride layer by plasma nitridation.

11. The method according to claim 9, wherein the high-k dielectric, metal gate, and eSiGe source/drain regions comprise a p-type input/output (I/O) device.

12. The method according to claim 9, comprising forming the dummy gate layer of amorphous silicon or polysilicon.

13. A method, comprising forming the dielectric material by:
forming an oxide layer on a substrate;
forming a nitride protection layer on the oxide layer;
forming an interfacial layer (IL) and a high-k dielectric layer on the oxide layer;
forming a metal gate on the high-k dielectric layer;
forming spacers on opposite sides of the metal gate;
forming embedded silicon germanium (eSiGe) source/drain regions at opposite sides of the metal gate in the silicon substrate and extending under the oxide layer; and
filling all space between the eSiGe source/drain regions and the metal gate along opposite edges of the oxide layer with the IL and high-k dielectric layer by:
forming a dummy gate layer on the nitride protection layer;
patterning the oxide, nitride, and dummy gate layers forming a dummy gate stack comprising a dummy gate, the nitride protection layer, and the oxide layer, wherein a portion of the oxide layer extends along the substrate beyond side edges of the dummy gate;
forming low-k dielectric spacers at opposite sides of the dummy gate stacks;
forming source/drain cavities in the substrate at opposite sides of the dummy gate stack;
growing the eSiGe source/drain regions in the source/drain cavities;
removing the dummy gate;
removing the nitride protection layer; and
depositing the IL and high-k dielectric layer between the first low-k dielectric spacers and along side edges of the oxide layer by atomic layer deposition (ALD).

14. The method according to claim 13, further comprising, performing plasma nitridation of the portion of the oxide layer.

15. The method according to claim 14, further comprising a nitride layer between the metal gate and the spacers, the nitride layer being formed by plasma nitridation of sidewalls of the dummy gate concurrently with plasma nitridation of the portion of the oxide layer.

* * * * *